United States Patent [19]
Wu

[11] Patent Number: 6,127,712
[45] Date of Patent: Oct. 3, 2000

[54] MOSFET WITH BURIED CONTACT AND AIR-GAP GATE STRUCTURE

[75] Inventor: Shye-Lin Wu, Hsinchu, Taiwan

[73] Assignee: Texas Instruments—Acer Incorporated, Hsinchu, Taiwan

[21] Appl. No.: 09/346,041

[22] Filed: Jul. 6, 1999

Related U.S. Application Data

[63] Continuation-in-part of application No. 09/083,610, May 22, 1998.
[51] Int. Cl.[7] .................................................. H01L 29/76
[52] U.S. Cl. .......................... 257/410; 257/411; 257/386; 257/900; 438/287
[58] Field of Search .................... 257/410, 411, 257/386, 330, 288, 368, 900; 438/287

[56] References Cited

U.S. PATENT DOCUMENTS

| | | | |
|---|---|---|---|
| 5,389,557 | 2/1995 | Jung-Suk | 437/44 |
| 5,770,507 | 6/1998 | Chen et al. | 438/305 |

Primary Examiner—Sheila V. Clark
Assistant Examiner—H. D. Tran
Attorney, Agent, or Firm—Harness, Dickey & Pierce, P.L.C.

[57] ABSTRACT

A MOSFET with buried contacts and air-gap gate structure is disclosed. The MOSFET comprises trench isolation regions on a silicon substrate. A poly gate on the active region is formed of a gate dielectric layer and a polysilicon layer, wherein the polysilicon layer is in the midst of a portion of the gate dielectric layer so that there are two unoccupied gate dielectric regions at two sides of polysilicon layer. A first buried contact and second buried contacts are doped polysilicon layer being with respective vertical portions back to back adjacent two terminals of the gate dielectric layer and with respect horizontal portions extended to the trench isolation regions. A CVD oxide layer is formed atop the first buried contact, the poly gate, and the second buried contact to form the air gaps therein. The source/drain regions are underneath the first and second buried contacts, respectively. Furthermore, the extended source/drain regions are extended from the source/drain regions to regions underneath unoccupied gate dielectric regions.

14 Claims, 6 Drawing Sheets

MOSFET WITH BURIED CONTACT AND AIR-GAP GATE STRUCTURE

CROSS-REFERENCE TO RELATED APPLICATIONS

The invention is a continuous in part of the application filed on May 22, 1998, with an application Ser. No. 09/083,610, assigned to same assignee but under different title, as shown above.

FIELD OF THE INVENTION

The present invention relates to a semiconductor device structure, and more specifically, to a MOSFET with buried contacts and air-gaps gate structure.

BACKGROUND OF THE INVENTION

Recently, the rapid progression of the microelectronic technology demands the devices with high speed and operates at a lower voltage to lessen the power consumption, as well as reduce the cost per unit chip. Generally, the method to approach such purpose is to scale the device dimension down. For example, for a CMOS device, as it scaling to 0.1 $\mu$m and operating at 1V range, is known to have the speed enhancement of about 3X performance than the 0.35 $\mu$m device operates at 3.3V. However, in short-channel MOSFETs, the stringent issues may suffer, such as hot carrier effects, punchthrough effects, parasitic resistance etc., are required to be overcome.

In addition, the parasitic capacitance—the gate fringe capacitor ($C_{FR}$), around the gate electrode of a MOSFET and the junction capacitance ($C_J$) are difficult to reduce. The lager values of the parasitic capacitance give longer RC delay time.

Hence, for realizing high speed and low-power ULSI, minimizing parasitic capacitance is demanded. The $C_{OV}$, the capacitance between source/drain and the gate, and $C_J$ can be reduced by adjusting the sidewall thickness, and by self-aligned counter well doping, or by implanting a channel impurity locally around the gate electrode, as is stated in the paper, "M. Togo, et al., "A Gate-side Air-gap Structure (GAS) to Reduce the Parasitic Capacitance in MOSFETs", Symp. On VLSI Tech. Dig., p. 38 (1996)." Besides, Togo et al. also proposed that the transistor with gate-side air-gap structure (GAS) could be used to minimize the $C_{FR}$. The GAS in which a 5-nm-wide air gap formed next to the gate is found to reduce the fringe capacitance by half. Hence the gate delay time is reduced by 4.8 psec at fan out=1 and 16 psec at fan out=3 in a 0.25 $\mu$m CMOS, and the power consumption is lowered compared to a conventional structure. In addition, the GAS structure does not be found to degrade electrical characteristics or reliability, as is depicted in the paper.

The fabrication of GAS structure as proposed by Togo is shown in FIGS. 1(a)–(d), and will restate as following: After gate is etching, a 20 nm wide $Si_3N_4$ sidewall is fabricated (FIG. 1(a)). Next, a 50 nm thickness $SiO_2$ is formed, and is followed by etching back (FIG. 1(b)). After that, the $Si_3N_4$ sidewall is removed by a wet etching to form the air gaps (FIG. 1(c)), and 50 nm thick $SiO_2$ layer is then deposited to form the air-gap cap and is etched back (FIG. 1(d)).

SUMMARY OF THE INVENTION

A MOSFET with buried contacts and air-gap gate structure is disclosed. The MOSFET comprises trench isolation regions on a silicon substrate. A poly gate on the active region is formed of a gate dielectric layer and a polysilicon layer, wherein the polysilicon layer is in the midst of a portion of the gate dielectric layer so that there are two unoccupied gate dielectric regions at two sides of polysilicon layer. The gate dielectric layer is formed of oxynitride. A first buried contact and second buried contacts are doped polysilicon layer being with respective vertical portions back to back adjacent two terminals of the gate dielectric layer. The respective horizontal portions of first and second buried contacts are extended to the trench isolation regions so that the souce/drain contact hole could define at there. A CVD oxide layer is formed atop the first buried contact, the poly gate, and the second buried contact to form the air gaps therein. The source/drain regions are underneath the first and second buried contacts, respectively. Furthermore, the extended source/drain regions are extended from the source/drain regions to regions underneath unoccupied gate dielectric regions.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A MOS transistor with buried contact and air-gap gate structure on a semiconductor substrate and a method for making the same are disclosed. The detailed processes will be described firstly and the structure is then summarized.

Figure 1A:
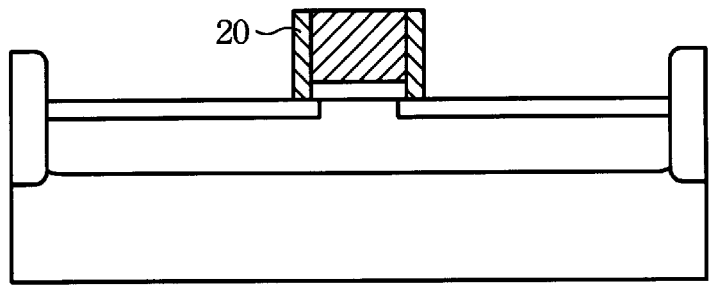
FIG. 1(a)–(d) is a cross-sectional view of a MOSFET with GAS structure in accordance with the prior art.
Figure 1B:
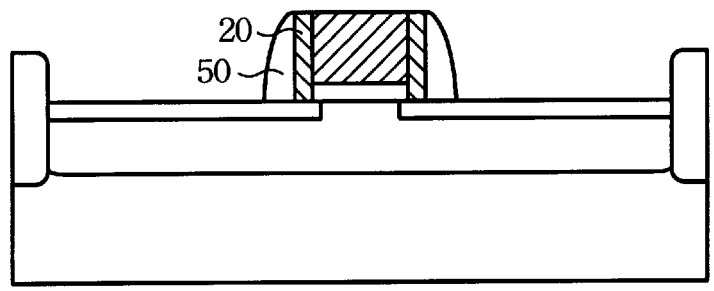
Figure 1C:
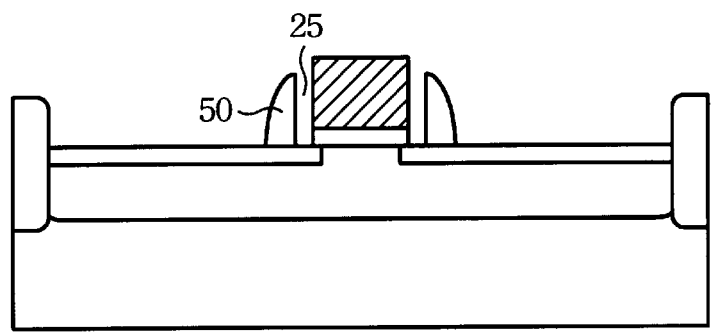
Figure 1D:
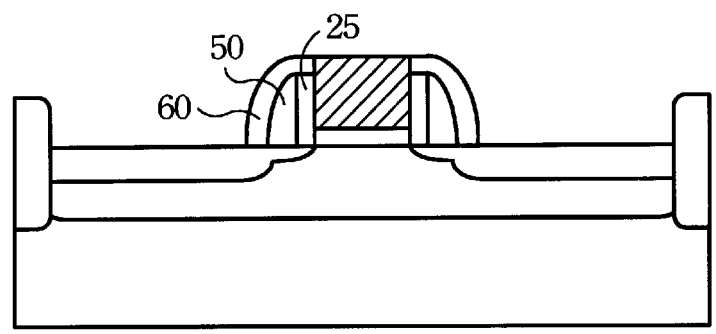
Figure 2:
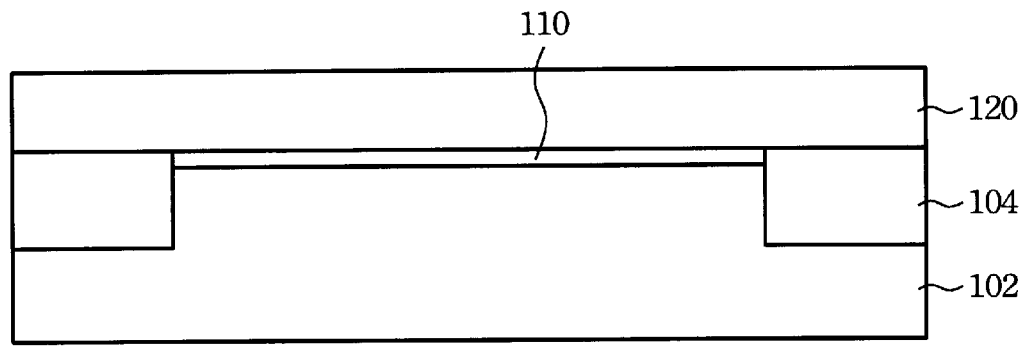
FIG. 2 is a cross-sectional view of a deposition of a pad oxide/nitride layer on a silicon substrate in accordance with the present invention.

FIG. 2 shows a cross-sectional view of a pad oxide layer 110 and a thick nitride 115 layer sequentially formed on a <001> orientation silicon substrate 102, which has shallow trench isolation (STI) regions 104 for isolating the active regions. In a preferred embodiment, the pad oxide 110 is formed by a CVD deposition method or by a thermal oxidation at a temperature of about 700–1050° C. The nitride layer 120 is deposited by a method such as low-pressure CVD (LPCVD) at about 600–800° C. to a thickness of about 100–300 nm.

Figure 3:
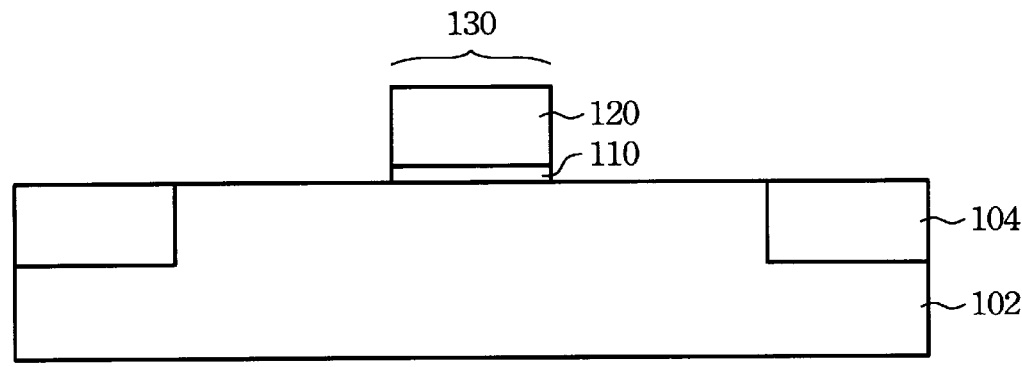
FIG. 3 is a cross-sectional view of forming a gate region on the substrate in accordance with the present invention.

Referring to FIG. 3, a photoresist (not shown) is deposited via a lithography technology to define a gate region 130. A dry etching method, such as a plasma etching or a reactive ion etching (RIE) method is performed to form the gate reigon 130. Preferably, the dry etching is used to remove away unmask portions by using the thin pad oxide layer 110 as an etch-stopping layer, and then follow by a wet etching to etch the remnant pad oxide 110 so that the damages occurred during the etching process can be minimized.

Figure 4:
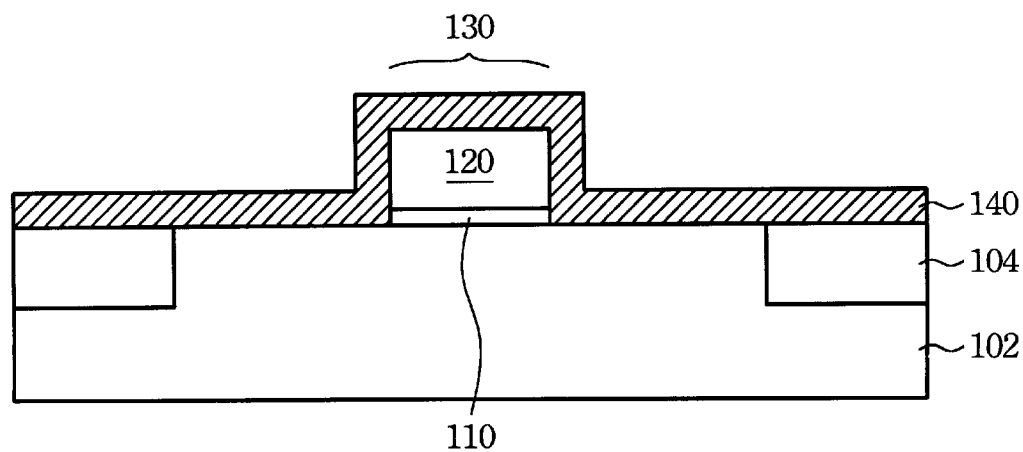
FIG. 4 is a cross-sectional view of deposited an undoped polysilicon layer on all areas in accordance with the present invention.

Subsequently, as shown in FIG. 4, an undoped polysilicon layer 140 is formed on the gate region 130 and elsewhere of the substrate 102. Preferably, the formation of the polysilicon layer 140 is achieved at a temperature of about 550–650° C. by LPCVD. The thickness of the polysilicon layer 140 is about 30–150 nm.

Figure 5:
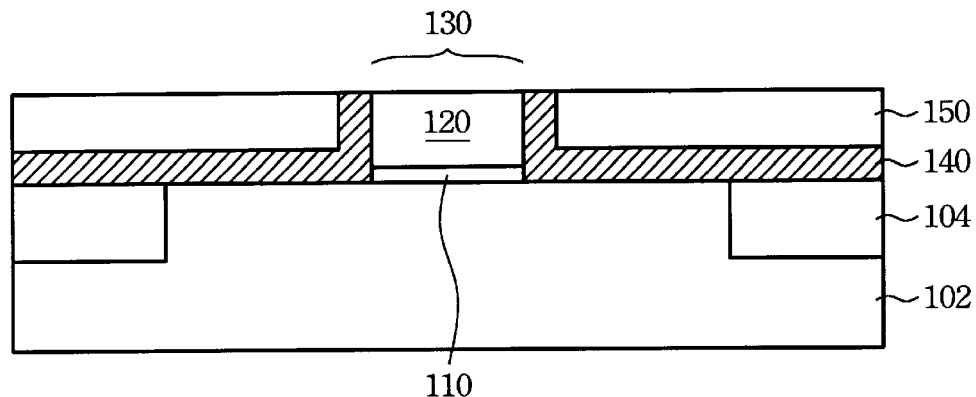
FIG. 5 is a cross-sectional view of deposited a CVD oxide layer on the polysilicon layer followed by a CMP in accordance with the present invention.

Please see FIG. 5, an oxide layer 150 is formed on the resulting surface of the polysilicon layer 140 by a CVD method. Then an etch-back process by CMP (chemical/mechanical polish) is performed using the nitride layer 120 as an etch-stopping layer.

Figure 6:
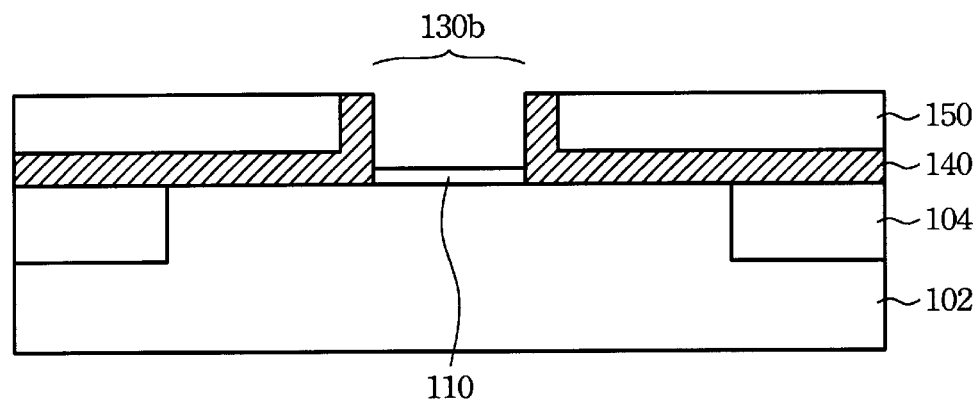
FIG. 6 is a cross-sectional view of removing the nitride layer to form a gate hollow region in accordance with the present invention.

Referring to FIG. 6, the nitride layer 120 in the gate region 130 is then removed by hot $H_3PO_4$ solution so that a gate hollow region 130b with the pad oxide layer 110 as bottom layer is left.

Figure 7:
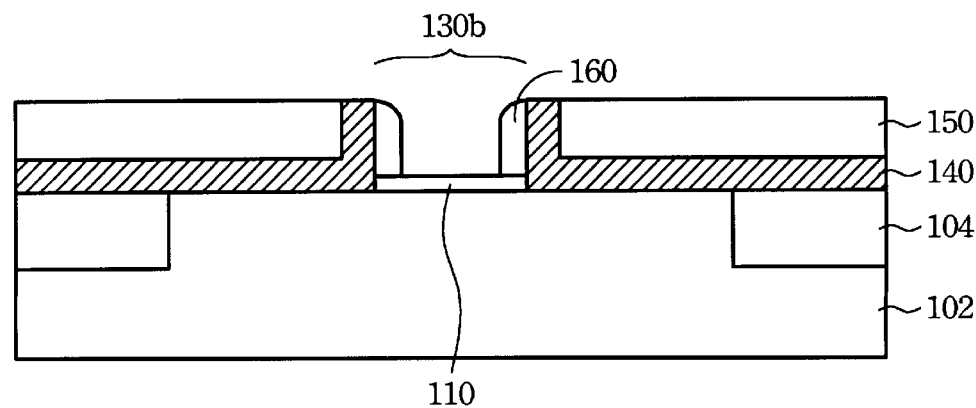
FIG. 7 is a cross-sectional view of forming nitride spacers on sidewalls of the gate hollow region in accordance with the present invention.

Referring to FIG. 7, nitride spacers 160 are formed on the sidewalls of the gate hollow region 130b by forming a thin nitride layer (not shown) using a LPCVD method on the resulting surface, and then performing an anisotropic etch. The thin nitride spacers 160 are about 10–100 nm in thickness.

Figure 8:
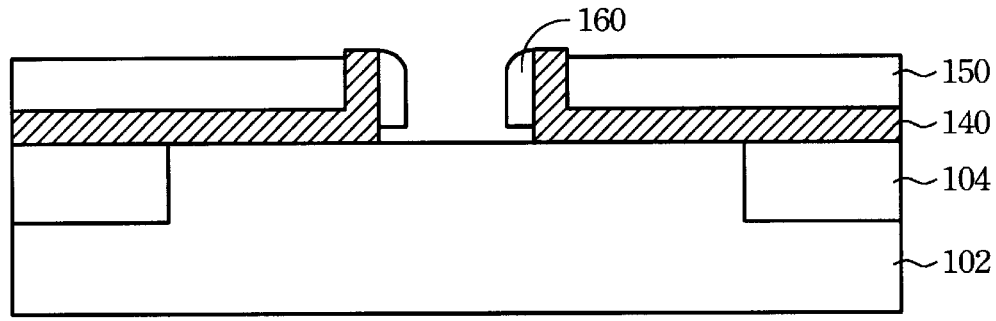
FIG. 8 is a cross-sectional view of removing pad oxide layer in accordance with the present invention.

Referring to FIG. 8, a removal of the pad oxide layer 110 is performed using an isotropic wet etch such as, diluted HF solution or buffer oxide etching solution (BOE) solution.

Figure 9:
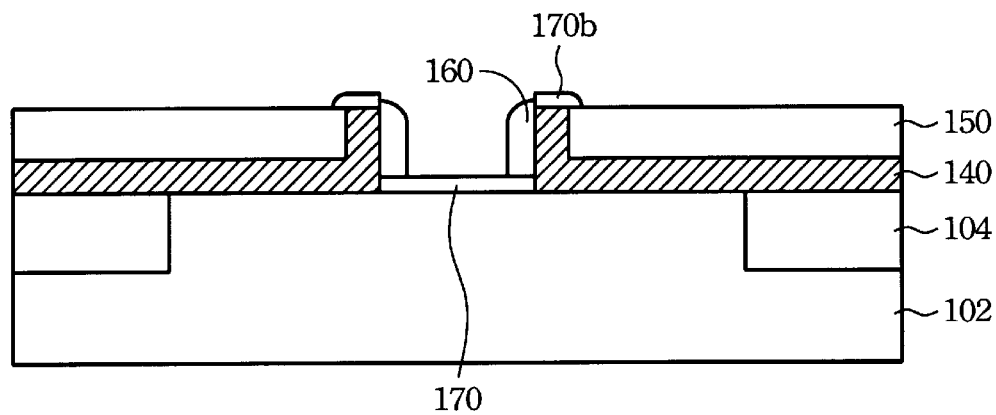
FIG. 9 is a cross-sectional view of forming a nitrogen rich gate oxide layer in accordance with the present invention.

FIG. 9, shows an ultra thin nitrogen rich gate oxide 170 and a polyoxide layer 170b are grown on the bottom of the gate hollow region 130b and the exposed portion of the undoped polysilicon layer 140 in a $N_2$ ambient but with diluted $O_2$, $N_2O$ or NO. Preferably, the ratio for $O_2$:$N_2$ is about 1:99 or 2:98, and the regrown temperature is about 700–1100° C. to about 2–20 nm in thickness.

Figure 10:
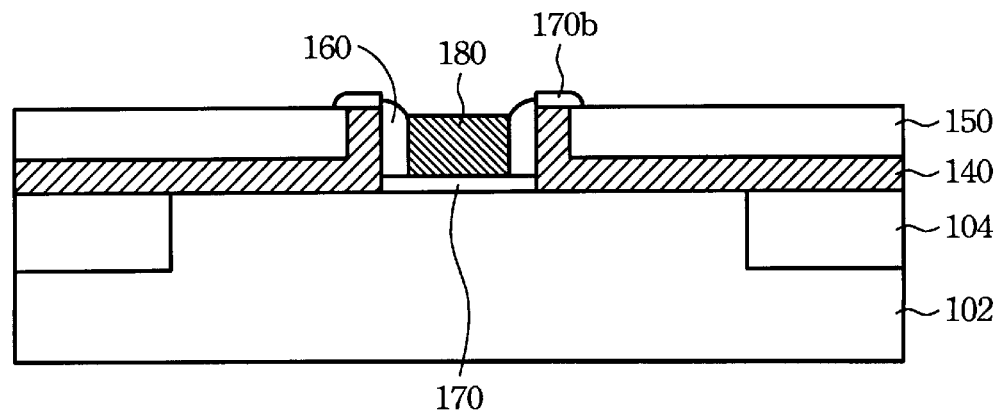
FIG. 10 is a cross-sectional view of performing an $\alpha$-Si deposition to refill the gate hollow region in accordance with the present invention.

Referring to FIG. 10, for the purpose of better step coverage, an undoped amorphous silicon layer 180 (hereafter called α-SI layer) is deposited on all areas and refilled in the hollow region 130b. Preferably, a PECVD method is conducted at a temperature of about 400 to 560° C. Then, another etch back process by CMP or a dry etch is performed using the oxide layer 150 as an etch-stopping layer.

Figure 11:
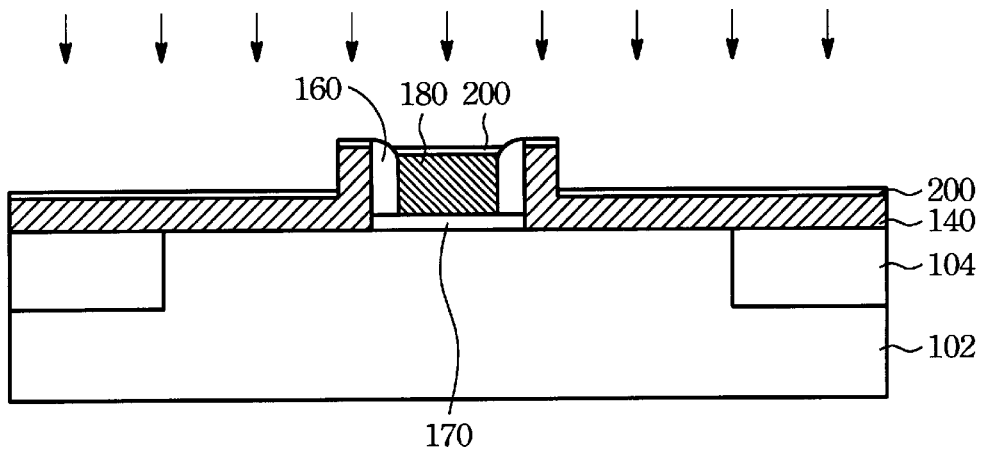
FIG. 11 is a cross-sectional view of performing an ion implant on all areas to form doped layer in the polysilicon layer and in the $\alpha$-Si region in accordance with the present invention.

Turning to FIG. 11, after the oxide layer 150 is removed by BOE solution or dilute HF, a low energy, heavy dose, source/drain/gate (S/D/G) implant (indicated by arrows direction) into polysilicon layer 140 and α-Si 180 by conductive impurities is followed. For nMOS, the conductive ions, such as $As^+$ or $P^+$, is preferred; however for pMOS, the conductive ions, is preferred using $BF_2^+$. The energy and the dosage are about 0.5–150 keV and about $10^{15}$–$5 \times 10^{16}$ /cm$^2$, respectively. The doped regions 200 are shown in the figure.

Figure 12:
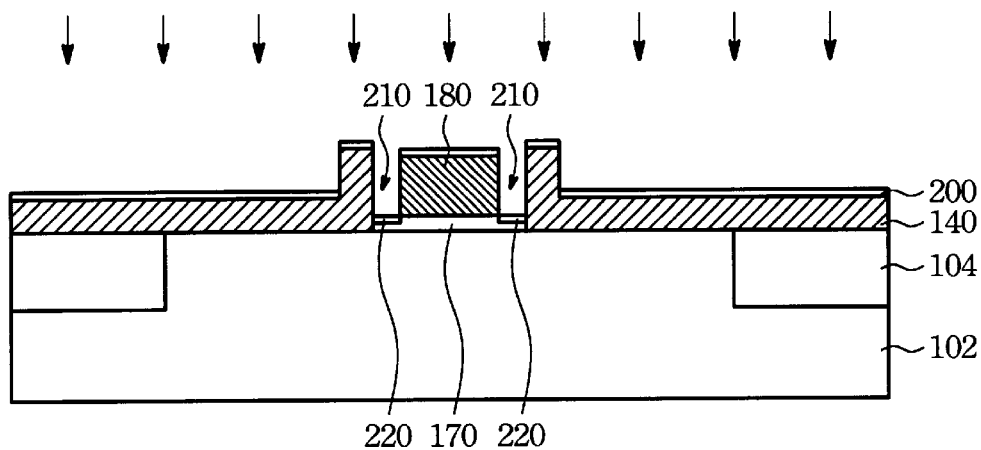
FIG. 12 is a cross-sectional view of performing a removal of nitride spacer to form a dual recessed region and then performing extended S/D ion implant in accordance with the present invention.

Referring to FIG. 12, for forming extended S/D regions (not shown), the nitride spacers 160 are removed firstly to become a dual-recessed space 210 and then a low energy, medium dose implant into all areas includes prior doped regions 200 and the recessed doped regions 220 is performed. In the preferred embodiment, for NMOS, the dose and energy for arsenic, or phosphorus ion implant are about 0.5–50 keV and $5 \times 10^{13}$–$2 \times 10^{15}$/cm$^2$, respectively. For pMOS, the conductive ions, is preferred using $BF_2^+$.

Figure 13:
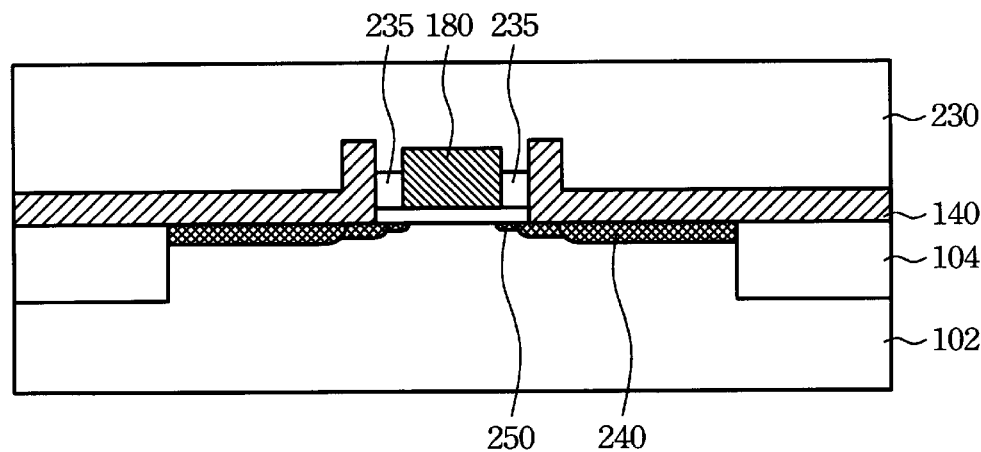
FIG. 13 is a cross-sectional view of forming an CVD oxide layer to seal the dual recessed region so as to form air gaps in the gate structure and to form S/D junction, extended S/D junction in accordance with the present invention.

Subsequently, referring to FIG. 13, a thick CVD oxide layer 230 of about 100–500 nm is deposited on all regions and concurrently formed the air-gaps 235 during sealed the recessed spaces 210. The oxide layer 230 is formed by a method selected from LPCVD, TEOS LPCVD and PECVD. For forming shallow source/drain (S/D)junctions 240 and extended S/D junctions 250, a high temperature annealing at a temperature of about 800–1100° C. for 0.1–100 min is performed. The impurities are driven in both lateral and longitudinal into interior of the silicon substrate 102 and are activated. The L-shaped and mirror L-shaped doped polysilicon layer 140 underlying the CVD oxide 230 is then served as buried contact so as to shrink the device area since the interconnect plugs can formed on the STI 104 without occupying the S/D areas 240. The contact holes formation to contact the source/drain regions and gate region, and tungsten filling process to form vias and the CMP are sequentially performed as shown in FIG. 14.

Figure 14:
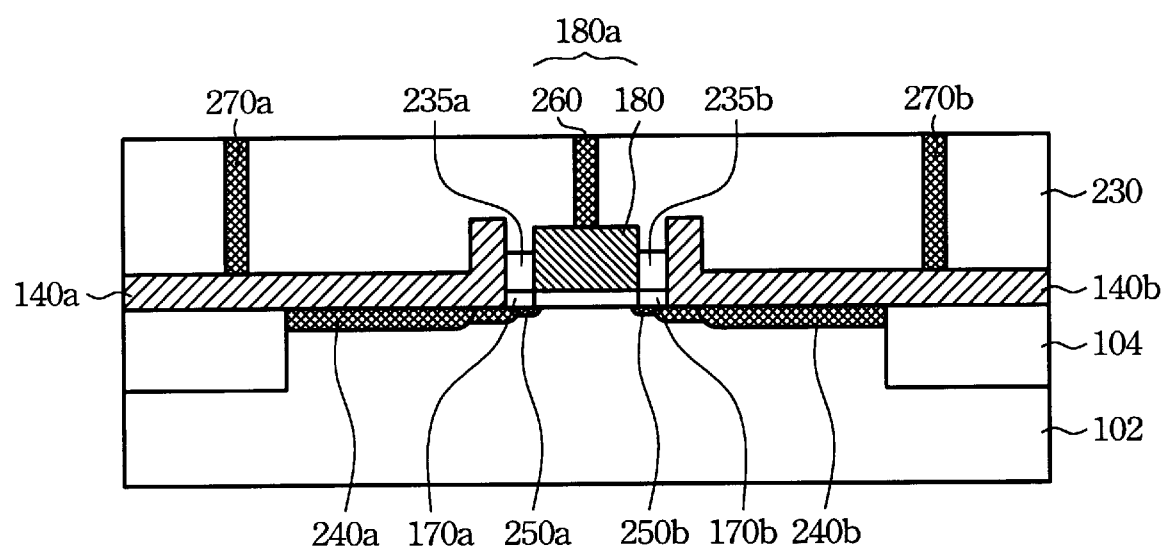
FIG. 14 is a cross-sectional view of MOSFET structure in accordance with the present invention.

For summarizing the MOSFET structure proposed by the invention, please refer to FIG. 14 (regenerating from FIG. 12). The structure of the MOSFET comprises:

A silicon substrate 102 has trench isolation regions 104, which define an active region in between. A poly gate 180a on the active region is formed of a gate dielectric layer 170 and a polysilicon layer 180 sequentially. The polysilicon layer 180 is mid a portion of the gate dielectric layer 170 so that there are first unoccupied gate dielectric region 170a at one side of polysilicon layer 180 and second unoccupied gate dielectric region 170b at the other side of polysilicon layer 180. A first buried contact 140a and a second buried contact 140b are doped polysilicon layer with a "L-shaped" like shape being with respective vertical portions back to back adjacent two terminals of the gate dielectric layer 170 and with respective horizontal portion extended to the trench isolation regions 104. A CVD oxide 230 layer is formed atop the first buried contact 140a, the poly gate 180a, and the second buried contact 140b to form the air gaps 235a and 235b. Since the spaces enclosed by the vertical portion of the first buried contact 140a with the poly gate 180a, and by the vertical portion of the second buried contact 140a with the poly gate 180a are slim and narrow so that the CVD oxide layer 230 couldn't fill fully the spaces. A first source/drain region 240a is underneath the first buried contact 140a. Furthermore, a first extended source/drain regions 250a is extended from the first source/drain region 240a to a region underlying the first unoccupied gate dielectric region 170b. The second source/drain region 240b and the second extended source/drain region 250b are formed symmetrically as the first source/drain region 240a and the first extended source/drain region 250a. The gate contact 260, first source/drain contact 270a and the second source/drain contact 270b filled with tungsten are also shown.

The benefits of the invention includes:

1) The ultra-short channel MOSFET can be achieved in terms of clarity define gate hollow.

2) The device speed is improved due to reduce the parasitic resistance by the extended source/drain junction and lessen the parasitic $C_{FR}$ and $C_{OV}$ by the air-gaps gate structure 3) The feature size of MOSFET is reduced due to the facts that the buried contacts are formed on both the source/drain and the STI region.

As is understood by a person skilled in the art, the foregoing preferred embodiment of the present invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

What is claim is:

1. A MOSFET with buried contacts and air-gap gate structure, said MOSFET structure comprising:

a silicon substrate having trench isolation regions, thereby defining an active region thereon;

a poly gate formed on said active region, said poly gate formed of a gate dielectric layer on said silicon substrate, and a polysilicon layer being mid a portion of said gate dielectric layer so that there are first unoccupied gate dielectric region at one side of polysilicon layer and second unoccupied gate dielectric region at the other side of polysilicon layer;

a first buried contact formed on said silicon substrate being adjacent one side of said gate dielectric layer;

a second buried contact formed on said silicon substrate being adjacent the other side of said gate dielectric layer;

an oxide layer being atop said first buried contact, said poly gate, and said second buried contact formed air gaps over said first and second unoccupied gate dielectric layers;

a first source/drain region in said active region underneath said first buried contact;

a second source/drain region in said active region underneath said second buried contact;

a first extended source/drain region being extended from said first source/drain region to a region underneath said first unoccupied gate dielectric region; and a second extended source/drain region being extended from said second source/drain region to a region underneath said second unoccupied gate dielectric region.

2. The MOSFET of claim 1, wherein said gate dielectric layer is an oxynitride layer.

3. The MOSFET of claim 1, wherein said gate dielectric layer has a thickness of about 2–20 nm.

4. The MOSFET of claim 1, wherein said first and second buried contact is about 30–150 nm in thickness.

5. The MOSFET of claim 1, wherein said first buried contact and second buried contact are doped polysilicon layer with "L-shaped" like shape being with respective vertical portions back to back adjacent two terminals of said gate dielectric layer.

6. The MOSFET of claim 5, wherein said vertical portion of said first and second buried contacts have about the same height as said poly gate.

7. The MOSFET of claim 5, wherein said first buried contact is with horizontal portion extended to a first one of said isolation regions, said first one said isolation regions being at same side as said first source/drain region.

8. The MOSFET of claim 5, wherein said second buried contact is with horizontal portion extended to the second one of said isolation regions, said second one said isolation regions being at same side as said second source/drain region.

9. A MOSFET with buried contacts and air-gap gate structure, said MOSFET structure comprising:

a silicon substrate having trench isolation regions therein to define an active region;

a poly gate formed on said active region, said poly gate formed of a gate dielectric layer on said silicon substrate, and a polysilicon layer being mid a portion of said gate dielectric layer so that there are first unoccupied gate dielectric region at one side of polysilicon layer and second unoccupied gate dielectric region at the other side of polysilicon layer;

a first buried contact and a second buried contact on said silicon substrate with "L-shaped" like shape, being with respective vertical portions back to back adjacent two terminals of said gate dielectric layer;

a CVD oxide layer being atop said first buried contact, said poly gate and said second buried contact, said CVD oxide layer enclosed air gaps within a space enclosed by said vertical portion of first buried contact and said poly gate and a space enclosed by said vertical portion of second buried contact and said poly gate;

a first source/drain region in said active region underneath said first buried contact;

a second source/drain region in said active region underneath said second buried contact;

a first extended source/drain region being extended from said first source/drain region to a region underneath said first unoccupied gate dielectric region; and a second extended source/drain region being extended from said second source/drain region to a region underneath said second unoccupied gate dielectric region.

10. The MOSFET of claim 9, wherein said gate dielectric layer is an oxynitride layer.

11. The MOSFET of claim 9, wherein said gate dielectric layer has a thickness of about 2–20 nm.

12. The MOSFET of claim 9, The MOSFET of claim 1, wherein said first and second buried contact is about 30–150 nm in thickness.

13. The MOSFET of claim 9, wherein said first and second buried contacts with respective horizontal portions extended to said isolation regions.

14. The MOSFET of claim 9, wherein said vertical portion of said first and second buried contacts have about the same height as said poly gate.

* * * * *